(12) United States Patent
Mani

(10) Patent No.: US 10,608,171 B2
(45) Date of Patent: Mar. 31, 2020

(54) SELF CONTACTING BIT LINE TO MRAM CELL

(71) Applicant: III Holdings 1, LLC, Wilmington, DE (US)

(72) Inventor: Krishnakumar Mani, San Jose, CA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 31 days.

(21) Appl. No.: 14/886,370

(22) Filed: Oct. 19, 2015

(65) Prior Publication Data

US 2016/0043308 A1 Feb. 11, 2016

Related U.S. Application Data

(62) Division of application No. 13/444,805, filed on Apr. 11, 2012, now abandoned.

(Continued)

(51) Int. Cl.
*H01L 43/12* (2006.01)
*G11C 11/16* (2006.01)
(Continued)

(52) U.S. Cl.
CPC .......... *H01L 43/12* (2013.01); *G11C 11/161* (2013.01); *H01L 43/08* (2013.01); *H01L 27/222* (2013.01)

(58) Field of Classification Search
CPC ....... G11C 11/161; G11C 11/16; G11C 11/15; G11C 11/1659; G11C 11/1675; G11C 11/1673; G11C 11/14; G11C 11/1657; G11C 11/36; G11C 13/00; G11C 8/10; G11C 11/165; G11C 11/5607; G11C 11/5678; G11C 13/0004; G11C 19/0808; G11C 19/0841; G11C 2213/52; G11C 2213/75; G11C 5/06; G11C 8/00; G11C 8/16; H01L 27/222; H01L 43/08; H01L 43/12; H01L 27/10882; H01L 27/115; H01L 27/11502; H01L 27/11507; H01L 27/11521; H01L 27/11568; H01L 27/24; H01L 29/40114; H01L 29/40117; H01L 29/42328; H01L 29/42352; H01L 29/66136; H01L 29/66825; H01L 29/7833; H01L 29/7835; H01L 29/7881; H01L 29/8613; H01L 31/02164; H01L 31/18; H01L 45/04; H01L 45/1246; H01L 45/1253; H01L 45/126; H01L 45/1273; H01L 45/128; H01L 45/16; H01L 45/1666; H01L 45/1683; H01F 10/3254;
(Continued)

(56) References Cited

U.S. PATENT DOCUMENTS 6,423,621 B2 * 7/2002 Doan ................... H01L 27/2463
257/20
7,611,941 B1 * 11/2009 Shum ................ H01L 21/28273
257/E21.179

(Continued)

*Primary Examiner* — Matthew C Landau
*Assistant Examiner* — Priya M Rampersaud
(74) *Attorney, Agent, or Firm* — McAndrews, Held & Malloy, Ltd.

(57) ABSTRACT

Embodiments of the invention disclose magnetic memory cell configurations in which a magnetic storage structure is coupled to an upper metal layer with minimal overlay margin. This greatly reduces a size of the memory cell.

18 Claims, 24 Drawing Sheets

Related U.S. Application Data

(60) Provisional application No. 61/473,921, filed on Apr. 11, 2011.

(51) Int. Cl.
  *H01L 43/08* (2006.01)
  *H01L 27/22* (2006.01)

(58) Field of Classification Search
  CPC ............... H01F 41/308; H01F 10/3272; H01F 10/3286; H01F 10/3295; H01F 41/302; H01F 41/34; H01F 10/3204; H01F 10/3263; H01F 10/3268; H01F 41/325
  See application file for complete search history.

(56) References Cited

U.S. PATENT DOCUMENTS

| | | | |
|---|---|---|---|
| 7,629,253 B2 * | 12/2009 | Tanaka | H01L 21/76883 257/E21.294 |
| 2003/0124854 A1 * | 7/2003 | Parker | G11C 11/16 438/692 |
| 2003/0203510 A1 * | 10/2003 | Hineman | B82Y 25/00 438/3 |
| 2004/0166631 A1 * | 8/2004 | Hurley | H01L 27/115 438/257 |
| 2004/0264240 A1 * | 12/2004 | Hineman | B82Y 25/00 365/158 |
| 2005/0083731 A1 | 4/2005 | Iwata | |
| 2005/0090056 A1 * | 4/2005 | Lee | H01L 27/222 438/257 |
| 2006/0054947 A1 | 3/2006 | Asao et al. | |
| 2007/0172964 A1 * | 7/2007 | Yen | H01L 43/12 438/3 |
| 2008/0283935 A1 * | 11/2008 | Sridhar | H01L 21/76232 257/390 |
| 2009/0224300 A1 * | 9/2009 | Yamagishi | G11C 11/161 257/295 |
| 2010/0110746 A1 * | 5/2010 | Hutchinson | G11C 11/16 365/51 |

* cited by examiner

MTJ size = f + 2δ
Top metal width = f + 4δ
  f: Minimum feature size
  δ: Overlay Margin To read Device MTJ size = f
Top metal width = f +2δ
  f: Minimum feature size
  δ: Overlay Margin

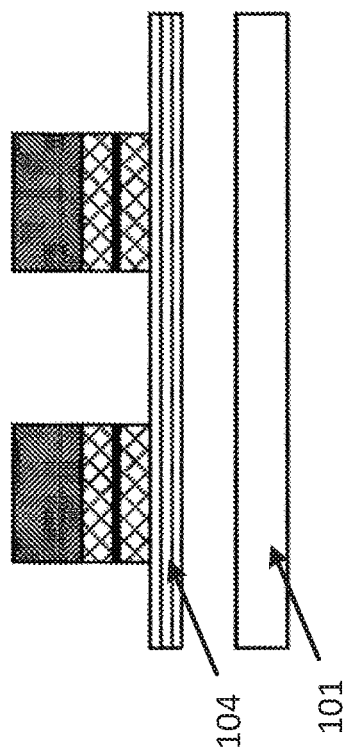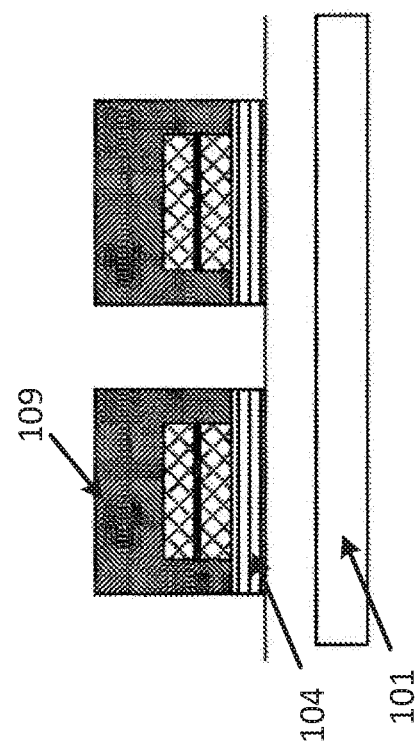
FIG. 4A
FIG. 4B
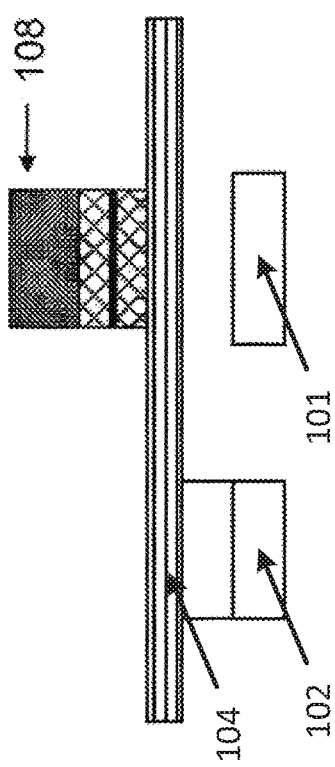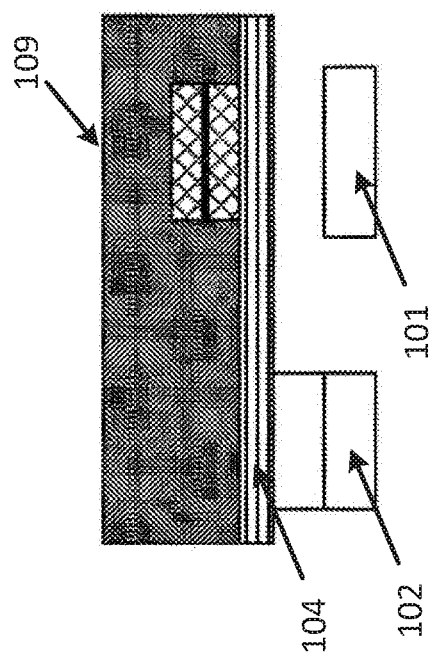
FIG. 3C
FIG. 3D

To read Device

MTJ size = f

Top metal width = f +2δ f: Minimum feature size

δ: Overlay Margin

MTJ size = f
Top metal width = f +2δ
  f: Minimum feature size
  δ: Overlay Margin MTJ size = f
Top metal width = f
        f: Minimum feature size
        δ: Overlay Margin MTJ size = f
Top metal width = f
 f: Minimum feature size
 δ: Overlay Margin

SELF CONTACTING BIT LINE TO MRAM CELL

This application is a divisional of U.S. patent application Ser. No. 13/444,805, titled "Self Contacting Bit Line to MRAM Cell," filed Apr. 11, 2012, which claims the benefit of priority to U.S. Provisional Patent Application No. 61/473,921, titled "Self Contacting Bit Line to MRAM Cell," filed Apr. 11, 2011.

FIELD

Embodiments of the invention relate to MRAM (Magnetic Random Access Memory) semiconductor devices.

BACKGROUND

MRAM (Magnetic Random Access Memory) cells may be fabricated during BEOL (Back End Of Line) after a MOS FET device process. The minimum feature size of an MRAM cell is often 1.5× larger than that of FEOL (Front End of Line). It is therefore difficult to shrink memory size compared with other FEOL based memories.

SUMMARY

Embodiments of the invention disclose a plurality of self-aligned structures that save the overlay margin.

The first embodiment discloses a MTJ cell wherein the MTJ stack is directly coupled to the upper metal without the requirement of a via. Sidewalls of individual MTJ elements are protected with dielectric film spacer to prevent from PIN-Switch layer shorting 10 through the tunnel oxide layer. The top layer of MTJ is exposed to upper metal. Overlay margin in this embodiment is required only for upper metal coverage over MTJ. The upper metal width comes to f+2∂, saving 2∂ compared to previous art. Putting MTJ feature size equal to that of FEOL, the memory size becomes competitive to FEOL based memory.

The second embodiment comprises an electrically conductive material such as Titanium Nitride, which is used as a hard mask. The hard mask is for MTJ stack etch and remains on top of MTJ pillar after the etching. Inter layer oxide is deposited over the MTJ pillar. The hard mask remained on MTJ is exposed with CMP. Metal such as Al/Cu is deposited and patterned with conventional lithography and Reactive Ion Etching. The same reduction in memory cell size as the first embodiment is provided by the second embodiment.

The third embodiment discloses a self-aligned via which replaces the hard mask. Silicon nitride is used as hard mask as an example. The hard mask is for MTJ stack etch and remains on top of MTJ pillar after the etching. Inter layer oxide is deposited over the MTJ pillar. The hard mask remained on MTJ is exposed with CMP or Dual Damascene oxide trench etch. The exposed hard mask is removed by hot phosphoric acid followed by upper metal deposition. The same squeezing memory cell size as the first embodiment is expected on the structure.

The fourth embodiment is of self-aligned etching. MTJ is to be etched twice along word line direction first and bit line direction $2^{nd}$. Putting dielectric film, nitride preferred, spacer on MTJ pillar to prevent PIN layer—Fix layer short. Oxide is deposited and planerized by CMP. The oxide is recessed until MTJ appeared. Upper metal layer is deposited patterned. MTJ and bottom read lead is etched with the same mask as upper metal. The upper metal is wrapping around MTJ pillar. It works to help induce magnetic field. The upper metal width can be same size as MTJ pillar. It saves 4∂ compared with prior arts.

The fifth embodiment is also of self-aligned patterning. It is different in read electrode connecting to top of MTJ instead of bottom of the pillar. MTJ is connected to lower metal (write word line). Top metal is electrically isolated from MTJ with a thin dielectric film. The upper metal also wraps around MTJ. It enhances magnetic field induction for switching. It saves cell footprint also by 4∂.

BRIEF DESCRIPTION OF THE DRAWINGS

While the appended claims set forth the features of the present invention with particularity, the invention, together with its objects and advantages, will be more readily appreciated from the following detailed description, taken in conjunction with the accompanying drawings, wherein:

FIG. 3A to FIG. 3H illustrate cross sectional views along bit line direction at individual process steps to the $1^{st}$ embodiment.

FIG. 4A to FIG. 4F illustrate cross sectional views along other direction of FIG. 3C to FIG. 3H.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form only in order to avoid obscuring the invention.

Reference in this specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Moreover, although the following description contains many specifics for the purposes of illustration, anyone skilled in the art will appreciate that many variations and/or alterations to said details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Figure 1A:
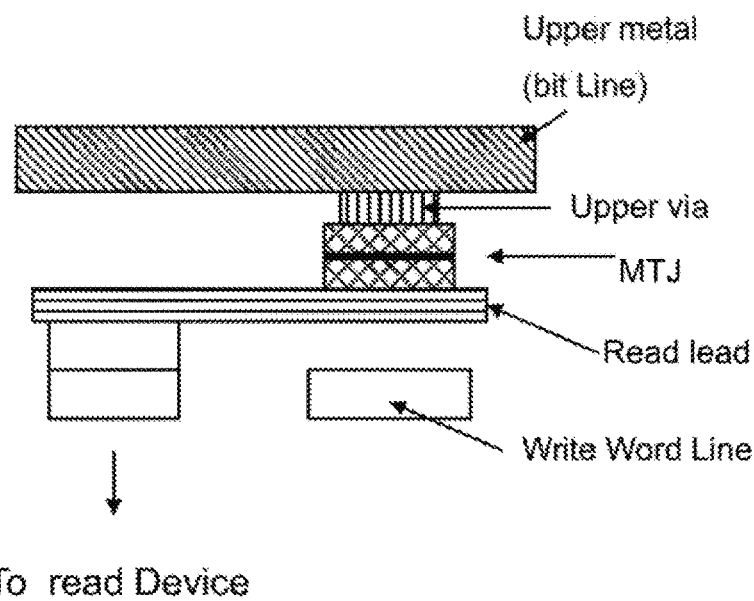
FIG. 1A illustrates a cross-sectional view of prior arts.
Figure 1B:
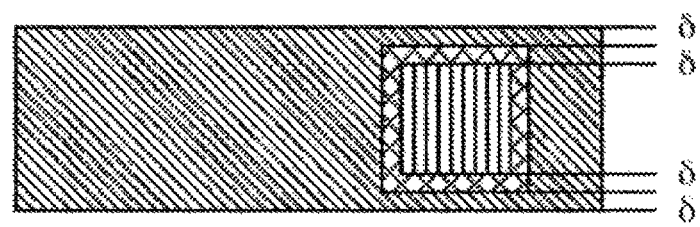
FIG. 1B illustrates a top view of prior arts.

Prior Art FIG. 1A shows a cross-sectional view through a prior art MRAM cell, whereas Prior Art FIG. 1B shows a plan view of the MRAM cell. As can be seen the MRAM cell includes a MTJ (Magnetic Tunnel Junction) as a memory element. The MTJ is connected to upper and lower metals through via holes where overlay margin a is required on the both edges of via hole landing area. The MTJ cell is designed to be bigger than the upper through hole to upper metal by 2∂. Since the upper metal should cover the MTJ, the upper metal becomes bigger than the MTJ by 2∂. The upper metal width consequently becomes 4∂ bigger than a feature size f of the via hole. Overlay margin is estimated to be 20% to 30% of the minimum feature size. The metal width would be twice bigger than minimum feature size.

Figure 2A:
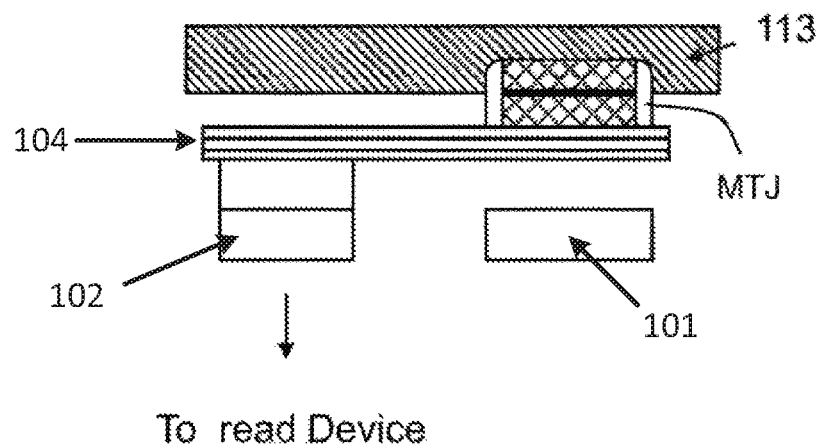
FIG. 2A illustrates a cross-sectional view of $1^{st}$ preferred embodiment.
Figure 2B:
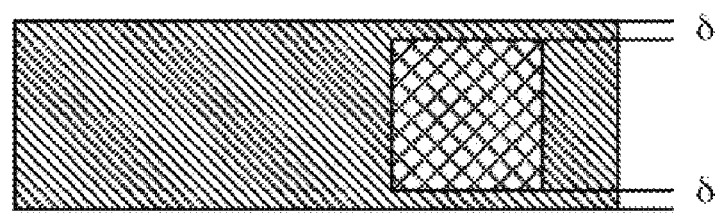
FIG. 2B illustrates a top view of $1^{st}$ preferred embodiment.

FIG. 2A shows a cross sectional view of a first embodiment of an MRAM cell. A top view of the first embodiment is shown in FIG. 2C. As will be seen, the upper metal 113 is directly connected to the top of MTJ. Overlay margin of MTJ to via is not necessary so that upper metal width becomes f+2∂ considering overlay margin of upper metal to MTJ. Thus, the first embodiments saves 2∂ compared to conventional structure showed in Prior Art FIG. 1A and Prior Art FIG. 1B.

Figure 3A:
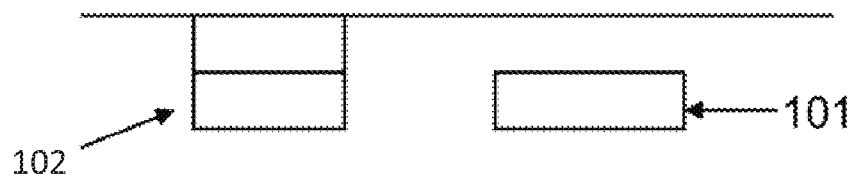
Figure 3B:
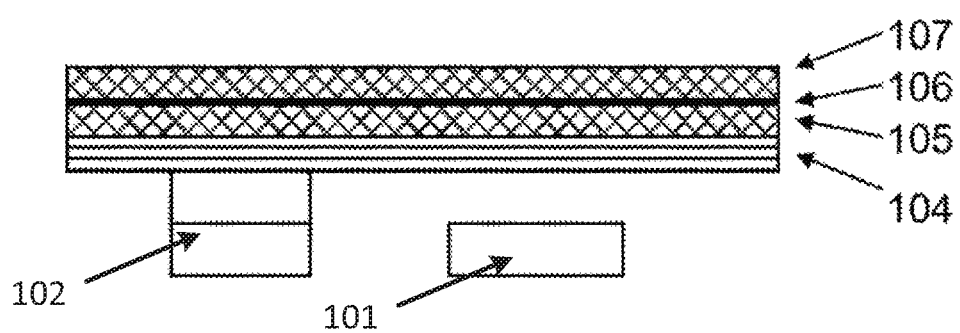
Figure 3E:
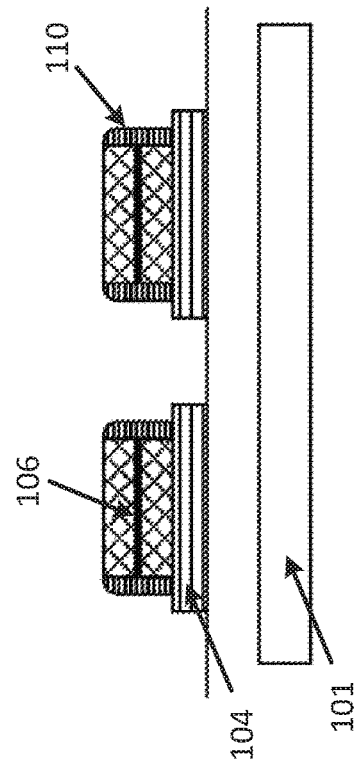
Figure 4D:
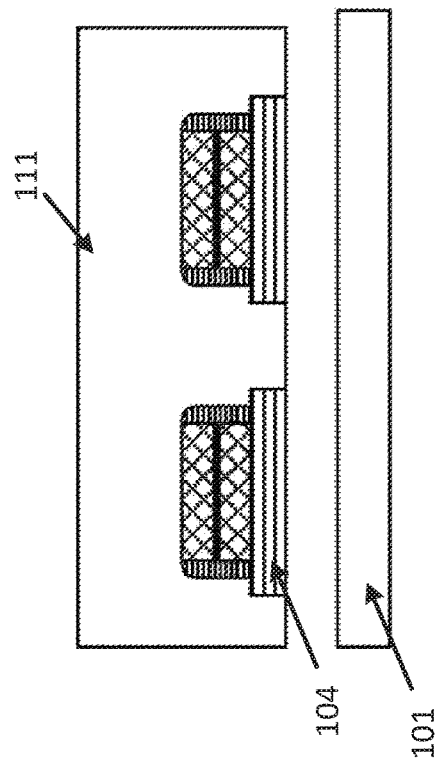
Figure 3F:
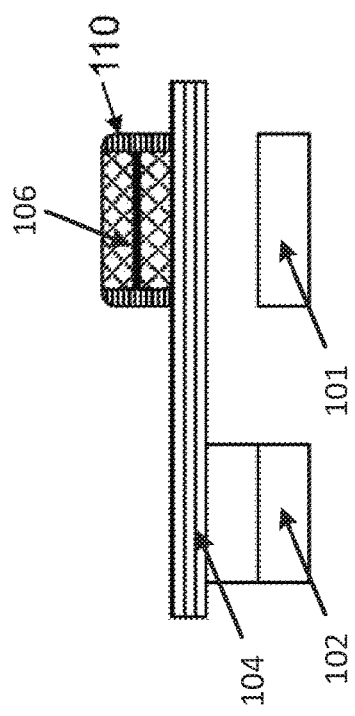
Figure 4C:
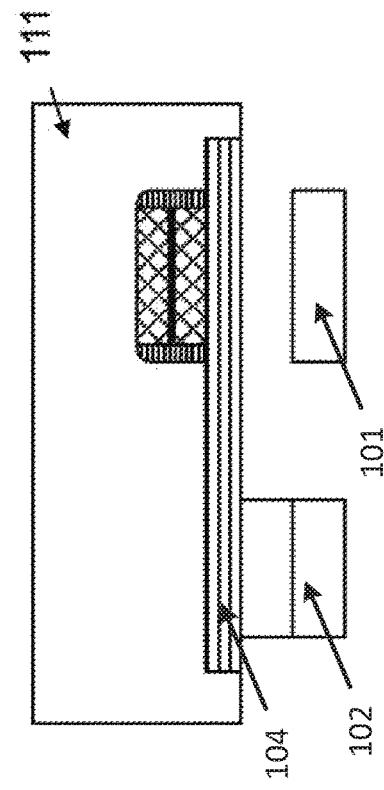
Figure 4E:
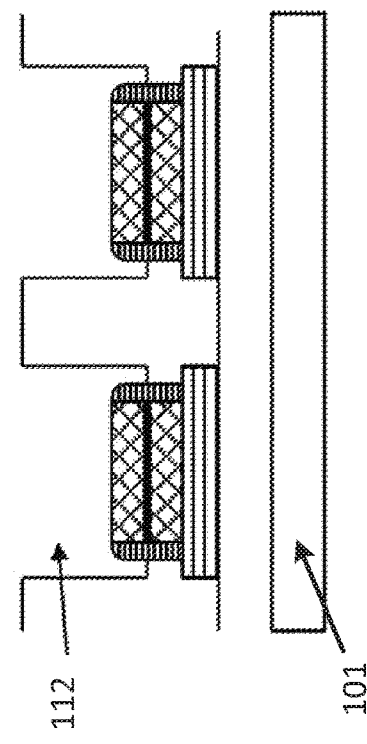
Figure 4F:
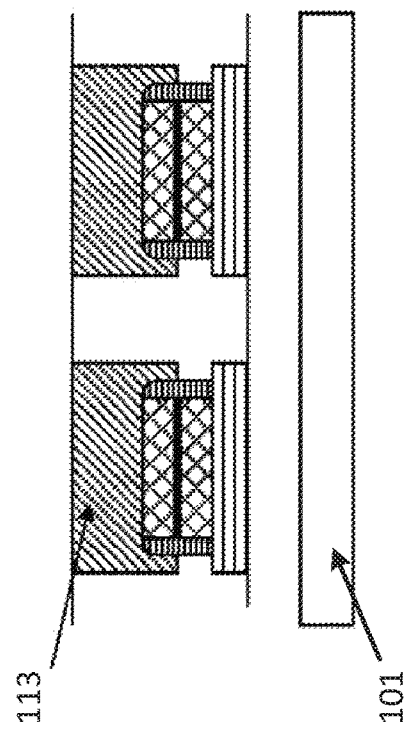
Figure 3G:
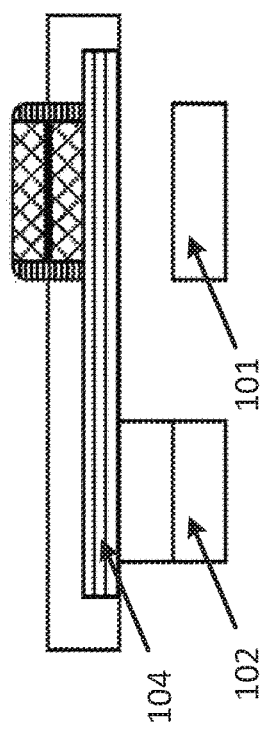
Figure 3H:
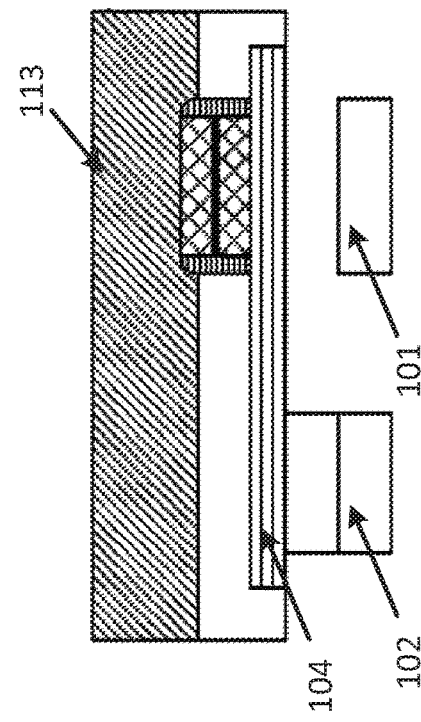

As shown in FIG. 3A, a lower metal as write word line 101 and landing pad 102 to read device are patterned after the FEOL process is completed. The surface over write word line is planerized with CMP. Bottom read lead 104, MTJ Pin layer 105, tunnel oxide 106, MTJ fixed layer 107 and hard mask layer are subsequently deposited as shown in FIG 3B. Patterning photo resist 108 with MTJ pillar mask in FIGS. 3C and 4A, MTJ stack (107, 106, 105) is etched with ion milling or reactive ion etch with end point at read lead metal 104 surface. Read lead metal is patterned with photo resist mask 109 and etched also with ion milling or reactive ion etch as shown in FIGS. 3D and 4B. A dielectric layer having enough etch selectivity to oxide such as nitride is deposited and vertically etched as shown in FIGS. 3E and 4C to put dielectric spacer 110 on MTJ sidewall to protect the junction 106. Oxide 111 as an inter dielectric layer is deposited and planerized as shown in FIGS. 3F and 4D. Trench line 112 is formed in oxide 111 using conventional damascene process. The trench etch goes until top of MTJ surface completely appears as shown in FIGS. 3G and 4E. Seed layer is deposited and copper 112 is plugged in trench with electro plating. Conventional copper CMP is used to remove excess copper outside of the trench as shown in FIGS. 3H and 4F.

Figure 5A:
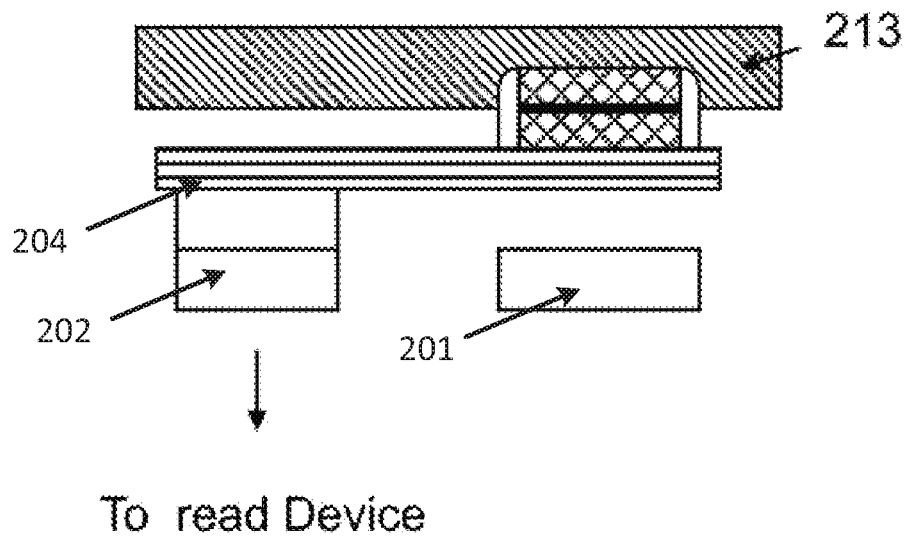
FIG. 5A illustrates a cross-sectional view of $2^{nd}$ preferred embodiment.
Figure 5B:
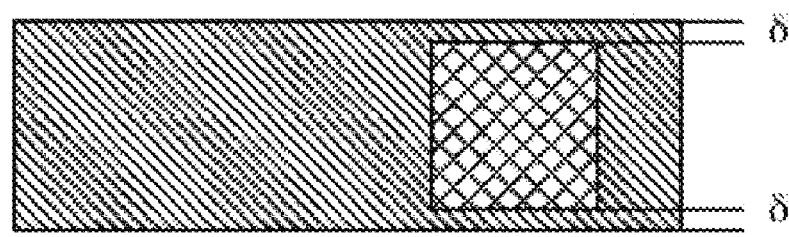
FIG. 5B illustrates a top view $2^{nd}$ preferred embodiment.

A cross sectional view of the $2^{nd}$ embodiment is shown in FIG. 5A. Top view is in FIG. 5B. The MTJ pillar is coupled to the upper metal 213 without the need of a via. Overlay margin of MTJ to via is thus not necessary so that upper metal width becomes f+2∂ considering overlay margin of upper metal to MTJ as discussed in the first embodiment. This embodiment saves 2∂ compared to conventional structure shown in Prior Art FIG. 1A and FIG. 1B.

Figure 6A:
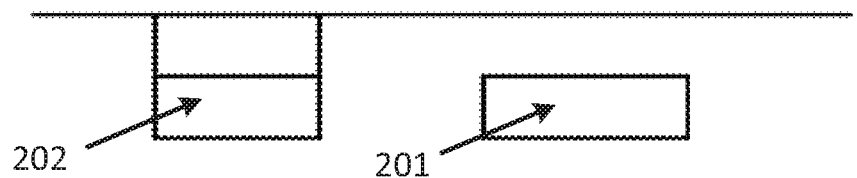
FIG. 6A to FIG. 6F illustrate cross sectional views along bit line direction at individual process steps to the $2^{nd}$ embodiment.
Figure 6B:
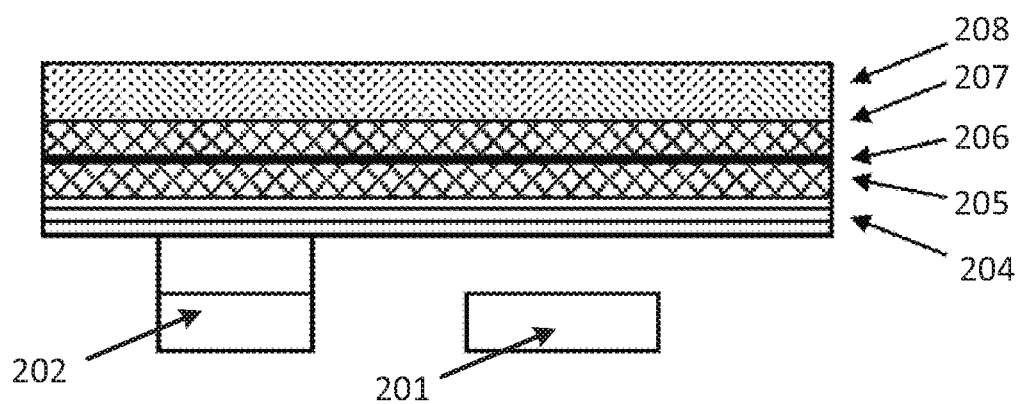
Figure 7A:
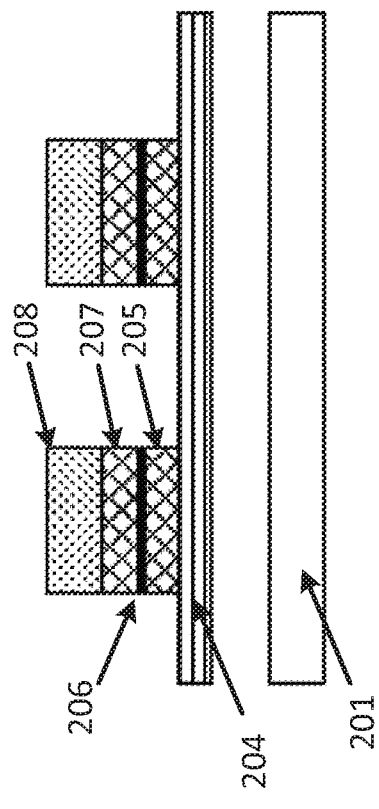
FIG. 7A to FIG. 7D illustrate cross sectional views along other direction of FIG. 6C to FIG. 6F.
Figure 7B:
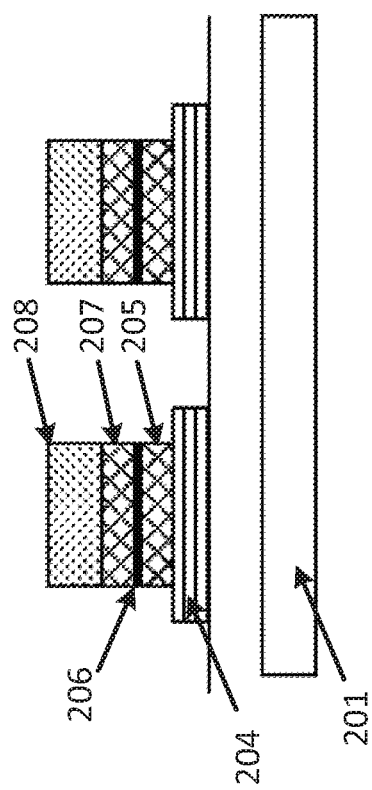
Figure 6C:
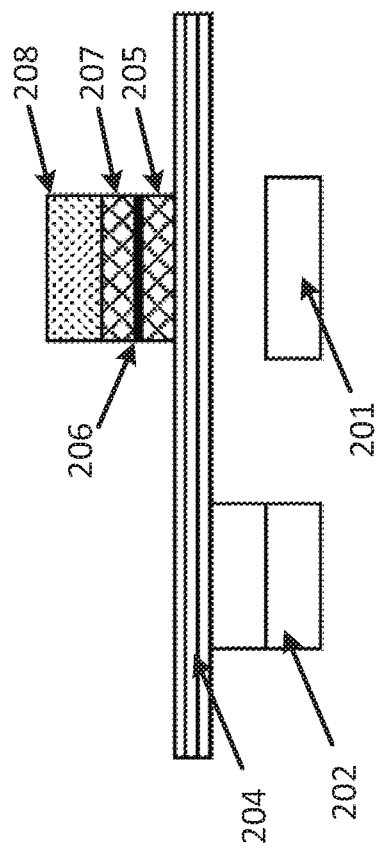
Figure 6D:
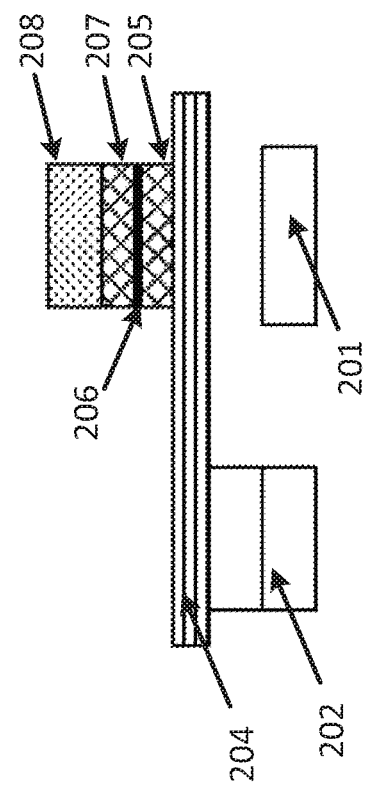
Figure 7C:
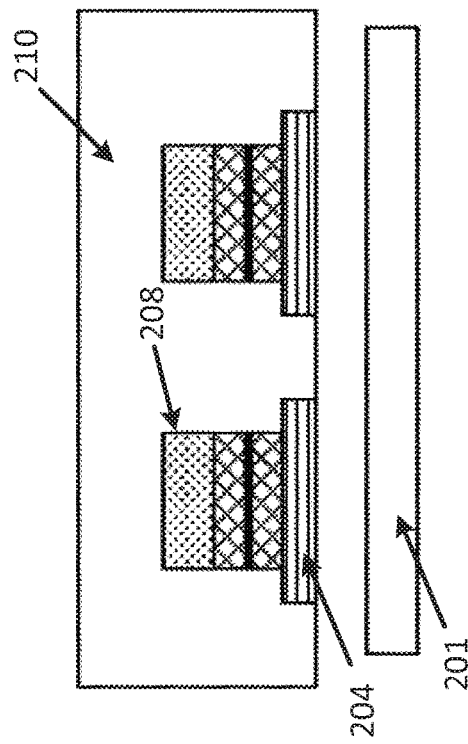
Figure 7D:
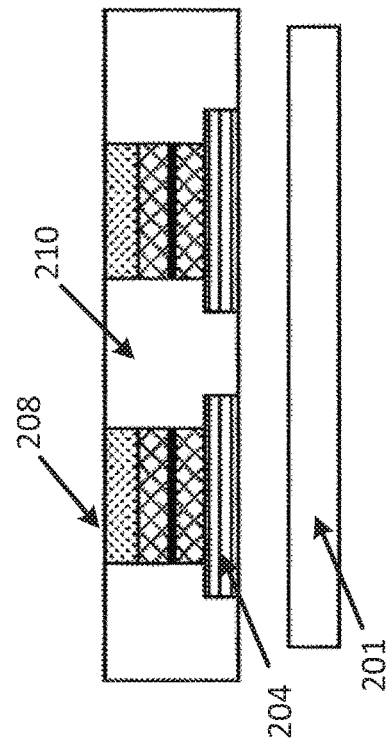
Figure 6E:
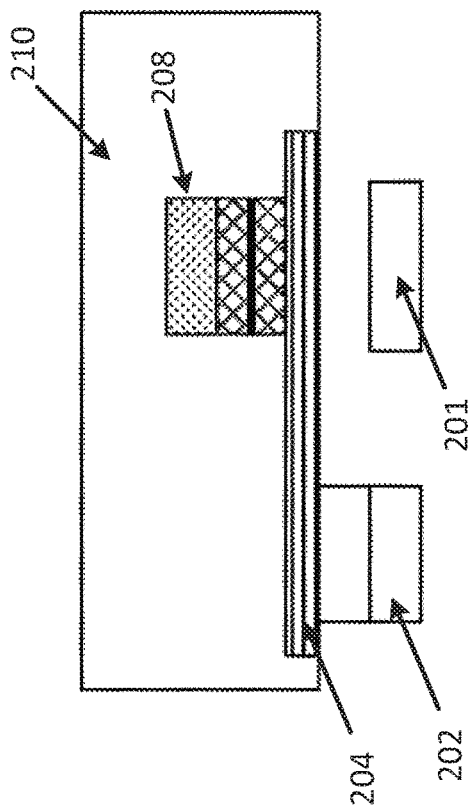
Figure 6F:
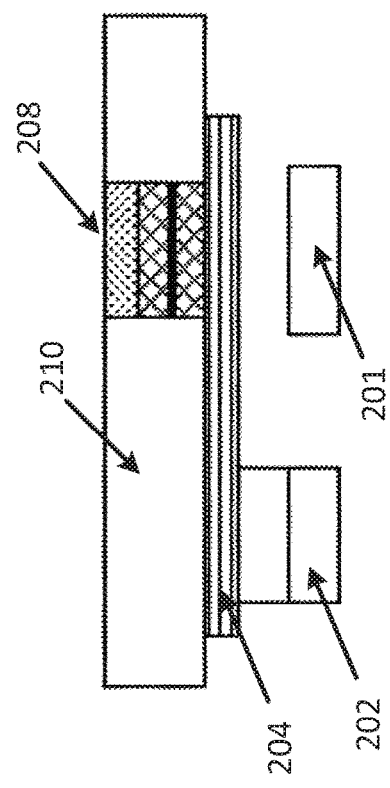

As shown in FIG 6A, lower metal as write word line 201 and landing pad 202 to read device are patterned after FEOL process is completed. The surface over write word line is planerized with CMP. Bottom read lead 204, MTJ Pin layer 205, tunnel oxide 206, MTJ fixed layer 207 and hard mask layer 208 consisting of oxide and Titanium nitride are subsequently deposited as shown in FIG 6B. Titanium Nitride layer and oxide layer 208 are patterned using conventional lithography and mask etch as shown in FIGS. 6C and 7A. Vertical ion etching with Ion milling or reactive ion allows to transfer the hard mask pattern into MTJ stack as in FIGS. 6D and 7B, with end point at read lead metal 204 surface, followed by read lead metal patterning similar to the first embodiment. Oxide 210 as an inter dielectric layer is deposited as shown in FIGS. 6E and 7C. CMP is allowed until Titanium nitride appears on surface as shown in FIGS. 6F and 7D, followed by conventional metal dry etch process.

Figure 8A:
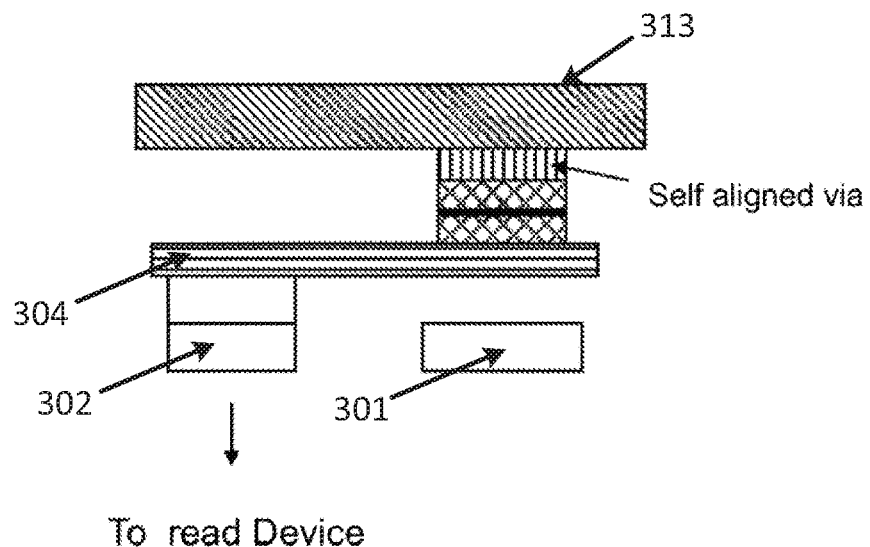
FIG. 8A illustrates a cross-sectional view of $3^{rd}$ embodiment.
Figure 8B:
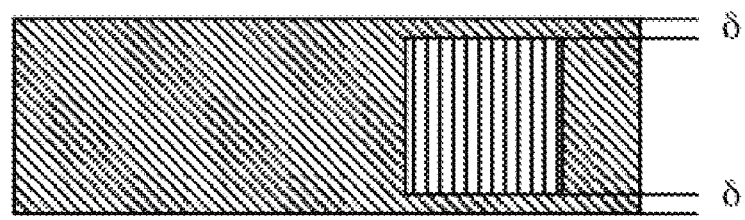
FIG. 8B illustrates a top view $3^{rd}$ embodiment.

A cross-sectional view of the $3^{rd}$ embodiment is shown in FIG. 8A. A top view of the $3^{rd}$ embodiment is shown in FIG. 8B. A self-aligned via connects the MTJ pillar/stack to the upper metal. Overlay margin of MTJ to via is not necessary so that upper metal width becomes f+2∂ considering overlay margin of upper metal to MTJ as discussed in the first embodiment. It save 2∂ compared to conventional structure showed in Prior Art FIG. 1A. and FIG. 1B.

Figure 9A:
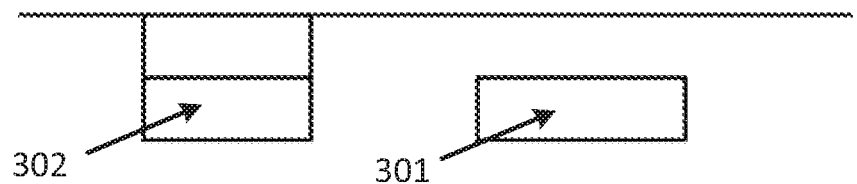
FIG. 9A to FIG. 9H illustrate cross sectional views along bit line direction at individual process steps to the $3^{rd}$ embodiment.
Figure 9B:
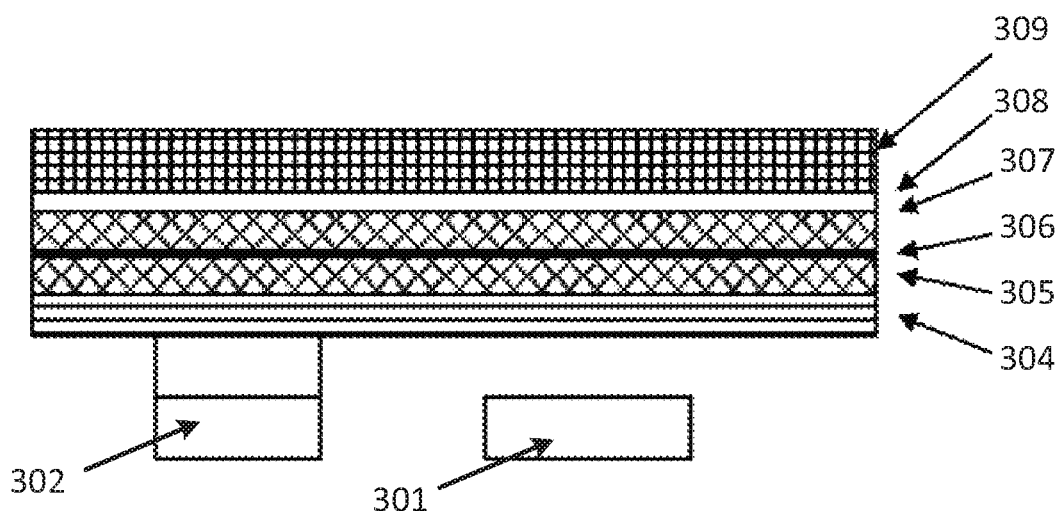
Figure 9C:
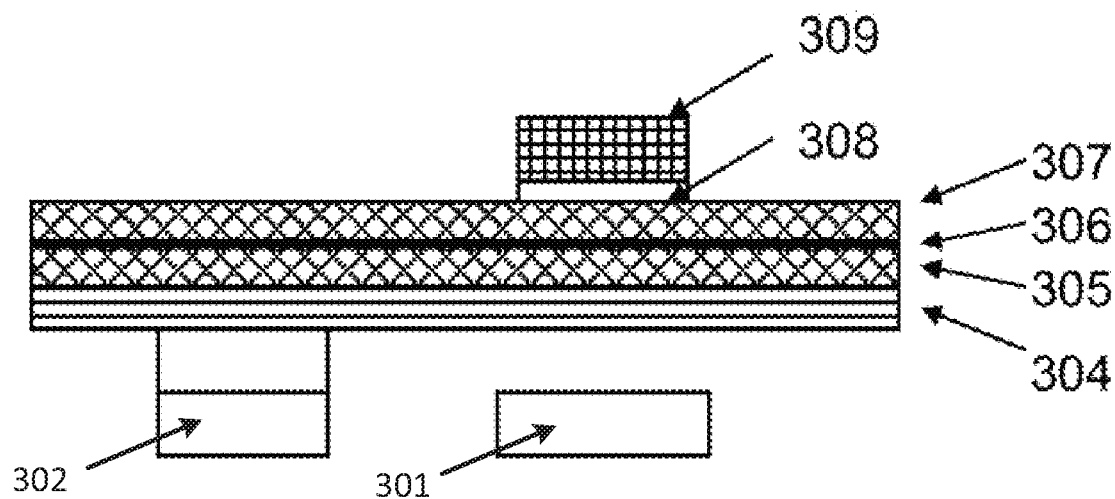
Figure 9D:
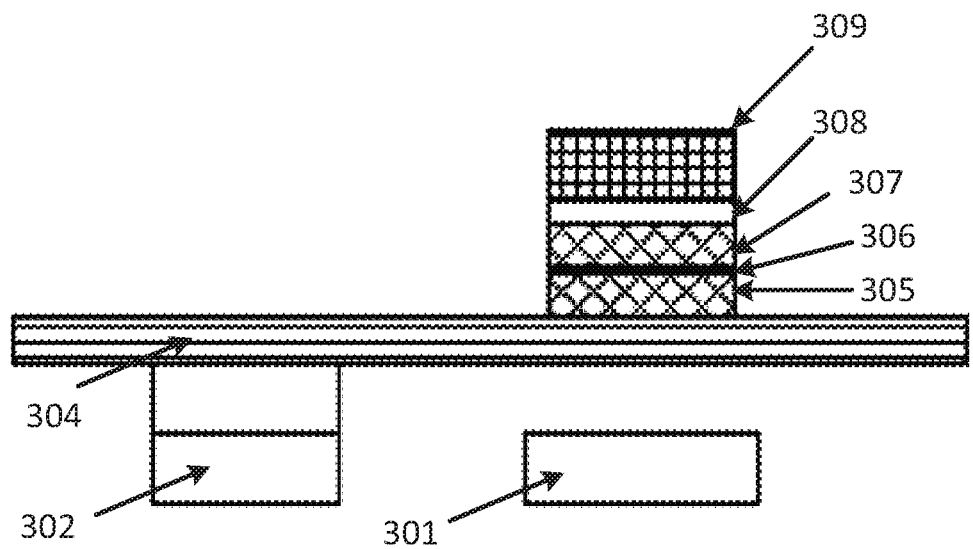
Figure 9E:
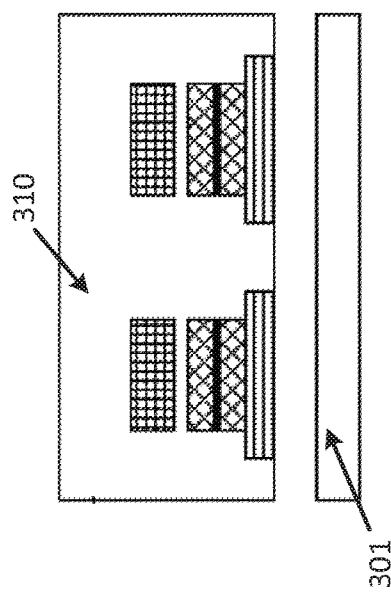
Figure 10A:
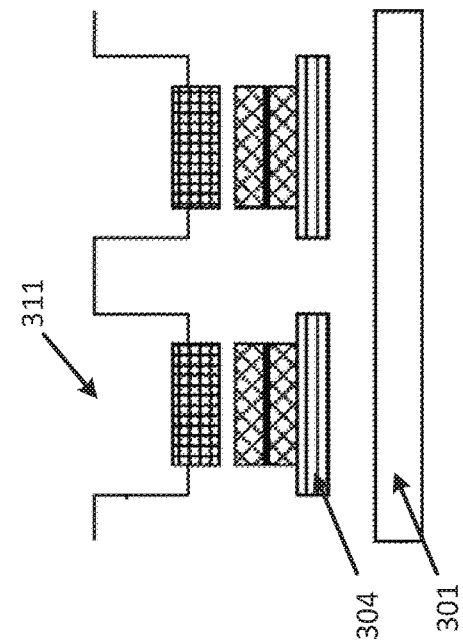
FIG. 10A to FIG. 10D illustrate cross sectional views along other direction of FIG. 9E to FIG. 9H.
Figure 9F:
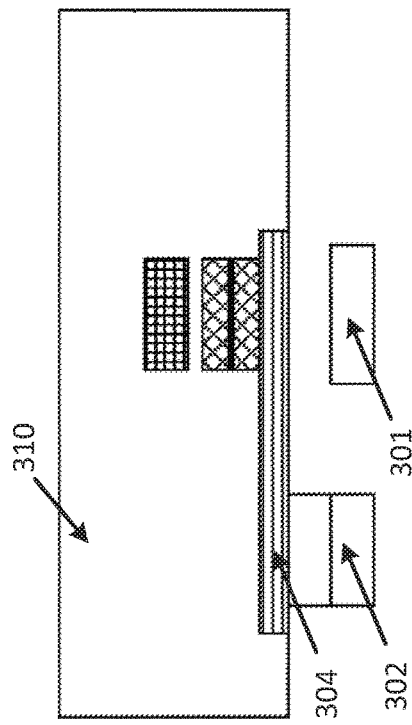
Figure 10B:
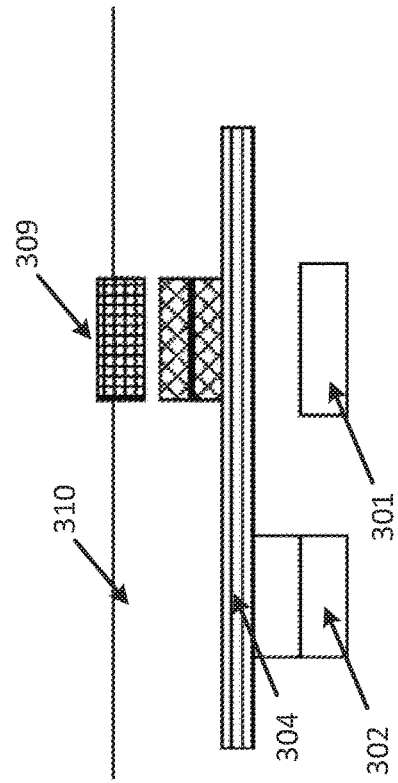
Figure 10C:
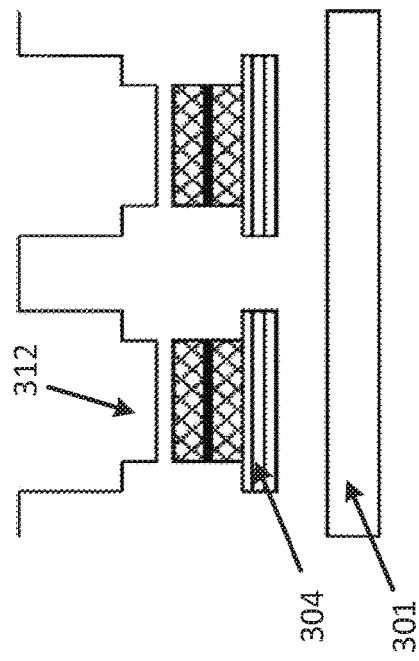
Figure 10D:
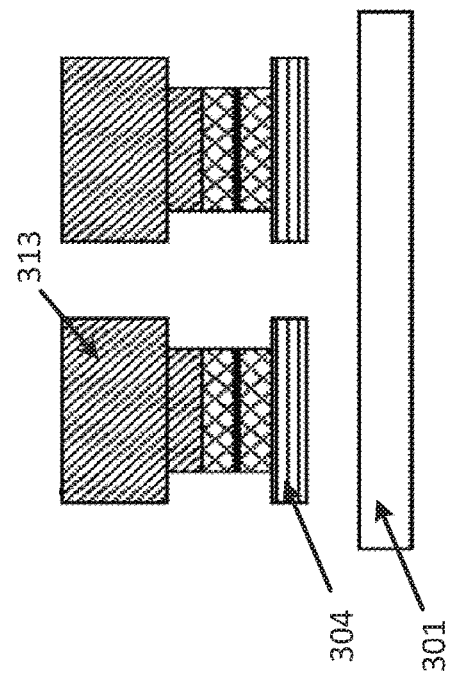
Figure 9G:
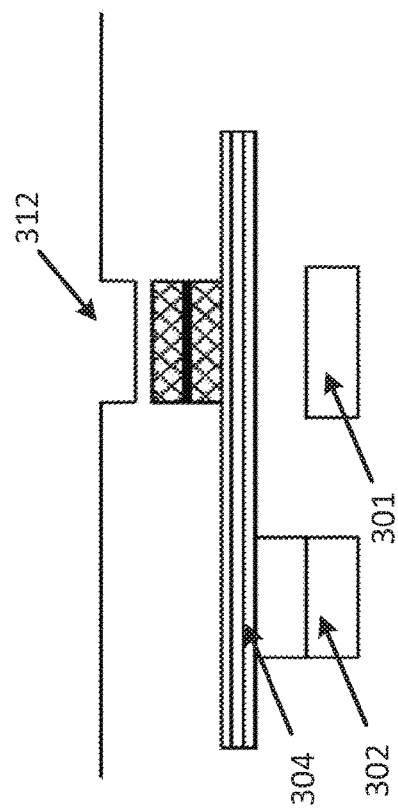
Figure 9H:
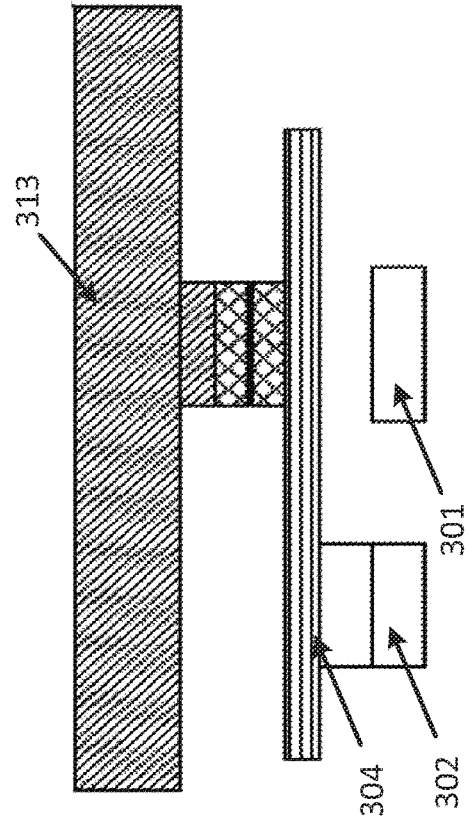

As shown in FIG. 9A, lower metal as write word line 301 and landing pad 302 to read device are patterned after FEOL process is completed. The surface over write word line is planerized with CMP. Bottom read lead 304, MTJ Pin layer 305, tunnel oxide 306, MTJ fixed layer 307 and hard mask layer consisting of bottom oxide 308 and nitride 309 are subsequently deposited as shown in FIG. 9B. Nitride layer and oxide layer are patterned using conventional lithography and mask etch as shown in FIG. 9C. Vertical ion etching with Ion milling or reactive ion etch allows to transfer the hard mask pattern into MTJ stack as in FIG. 9D, with end point at read lead metal 304 surface, followed by read lead metal patterning similar to the first embodiment. Oxide 310 as an inter dielectric layer is deposited and planerized as shown in FIGS. 9E and 10A. Trench line 311 is formed in oxide 310 using conventional damascene process. The trench etch goes until top of hard mask nitride surface completely appears as shown in FIGS. 9F and 10B. Exposed nitride 309 is removed with hot phosphoric acid as shown in FIGS. 9G and 10C. The self aligned via structure 312 delivered. Adding oxide etch, the oxide 308 over MTJ is etched and MTJ surface appears. Seed layer is deposited and copper 313 is plugged in trench with electro plating. Conventional copper CMP remove excess copper outside of the trench as shown in FIGS. 9H and 10D.

Figure 11A:
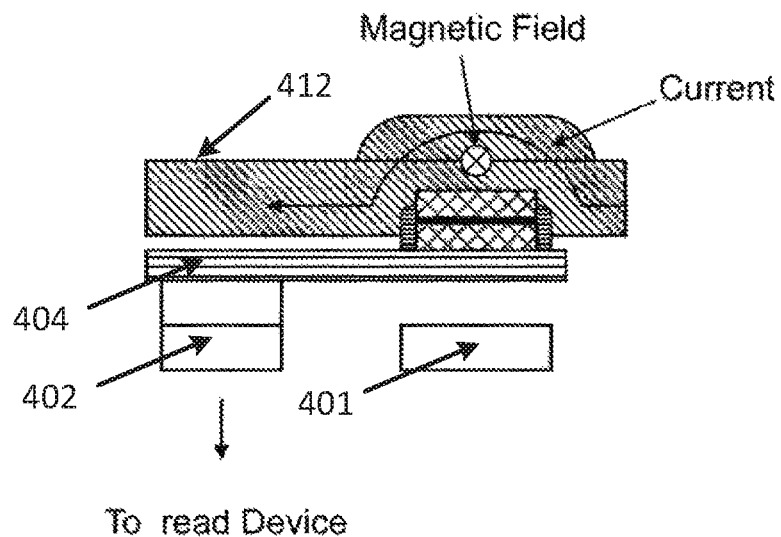
FIG. 11A illustrates a cross-sectional view of $4^{th}$ embodiment.
Figure 11B:
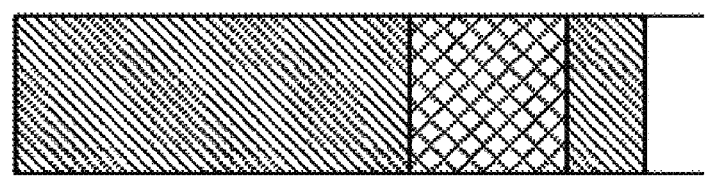
FIG. 11B illustrates a top view $4^{th}$ embodiment.

A cross-sectional view of the 4$^{th}$ embodiment is shown in FIG. 11A. A top view of the 4$^{th}$ embodiment is shown in FIG. 11B. MTJ is patterned twice. Firstly along the word line direction and secondly along the bit line direction. At 2$^{nd}$ patterning, upper metal layer, MTJ and bottom read lead are patterned with one mask. No overlay margin is required so that upper metal width becomes same feature size as MTJ. This embodiment saves 4∂ compared to conventional structure showed in Prior Art FIG. 1A and FIG. 1B. The structure has other benefit than cell size. The upper metal wraps around the MTJ. The current flowing the metal induces stronger magnetic field than straight metal line. It works better to switch the pin layer direction.

Figure 12A:
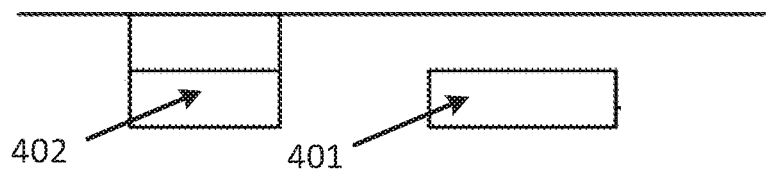
FIG. 12A to FIG. 12H illustrate cross sectional views along bit line direction at individual process steps to the $4^{th}$ embodiment.
Figure 12B:
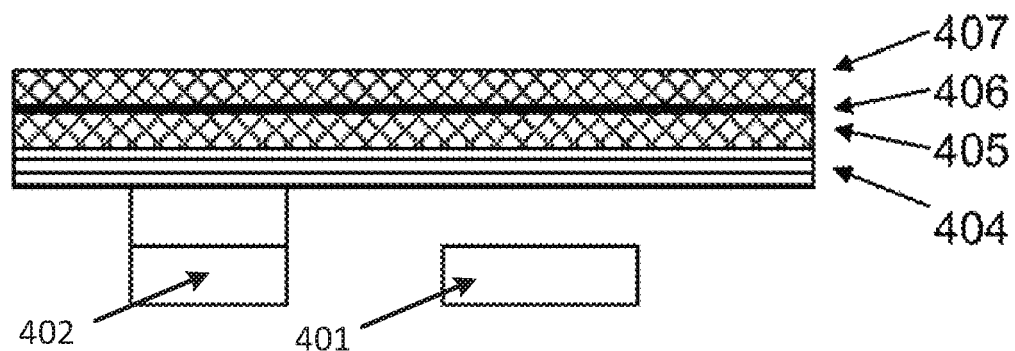
Figure 13A:
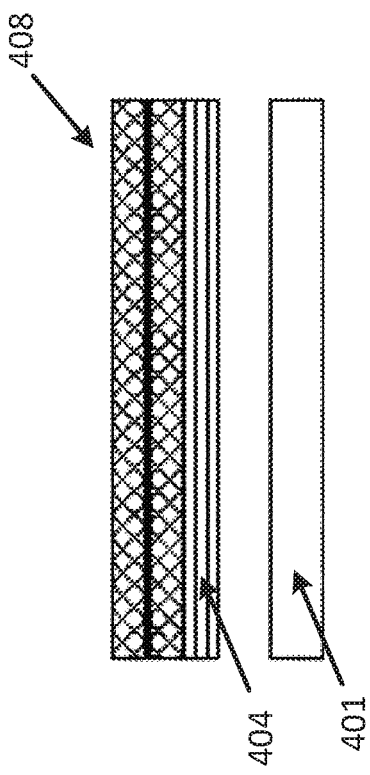
FIG. 13A to FIG. 13F illustrate cross sectional views along other direction of FIG. 12C to FIG. 12H.
Figure 13B:
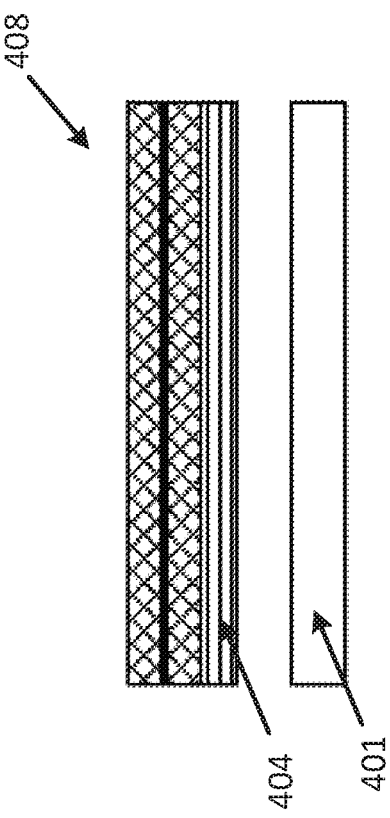
Figure 12C:
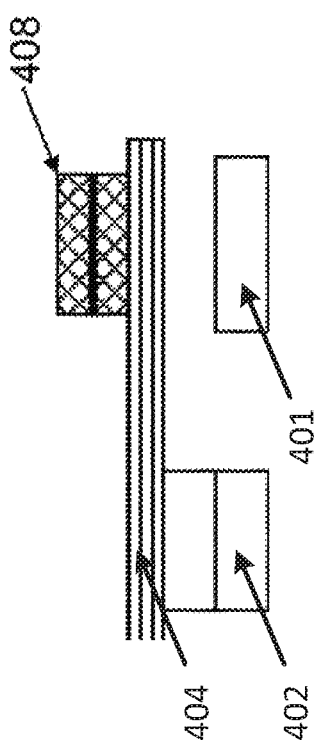
Figure 12D:
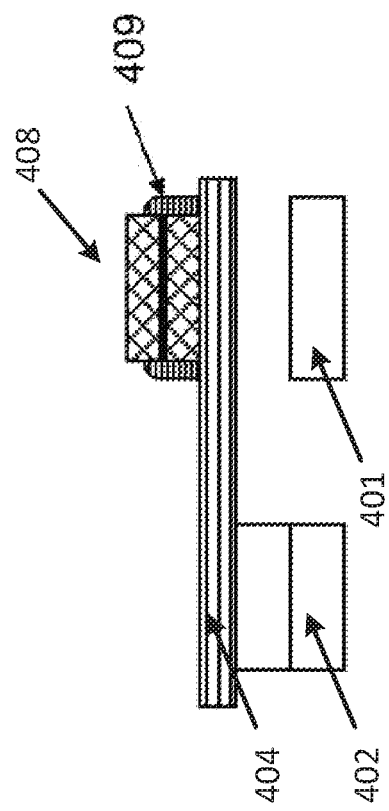
Figure 12E:
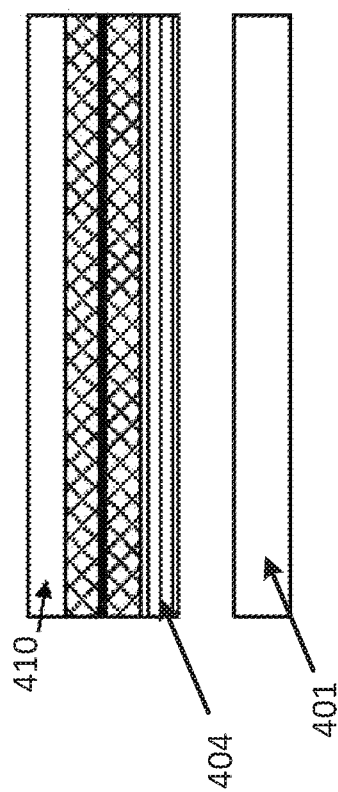
Figure 12F:
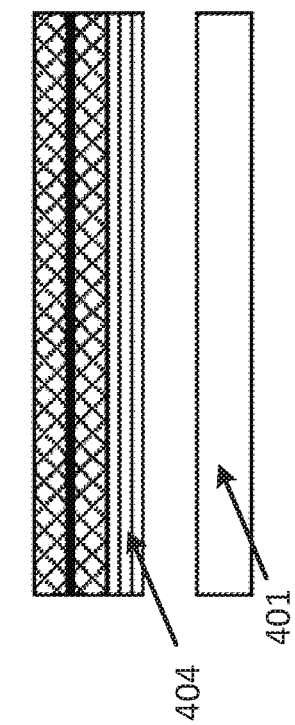
Figure 13C:
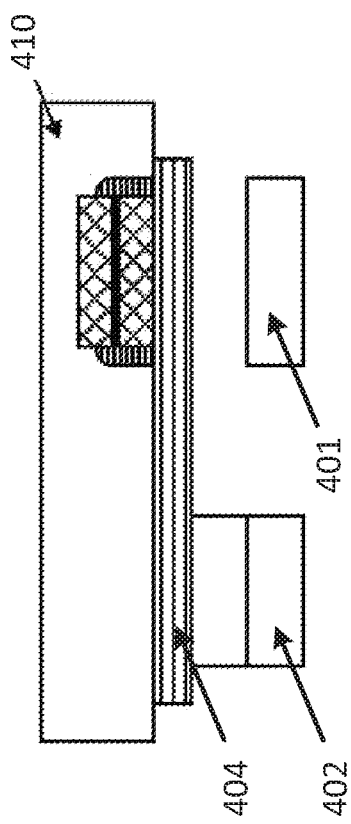
Figure 13D:
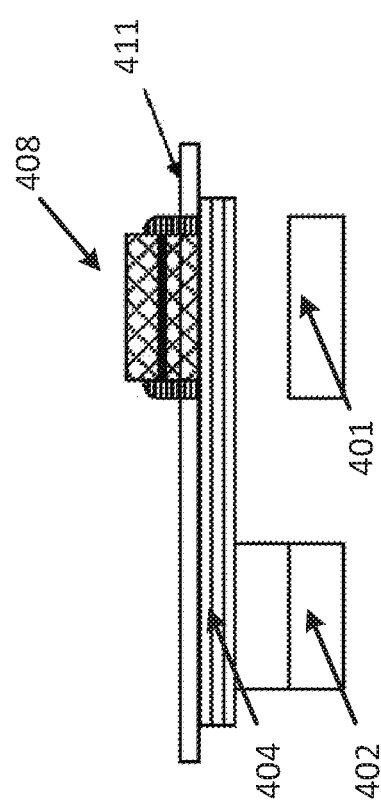
Figure 13E:
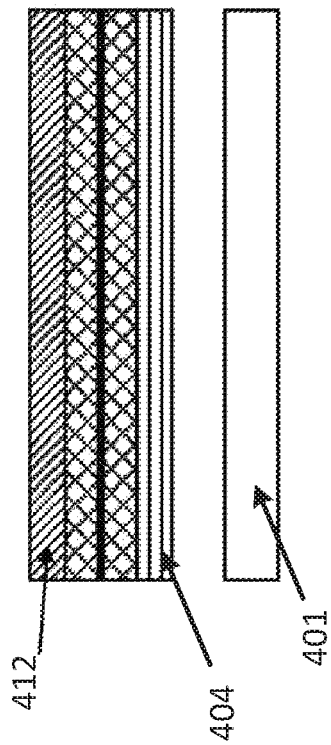
Figure 13F:
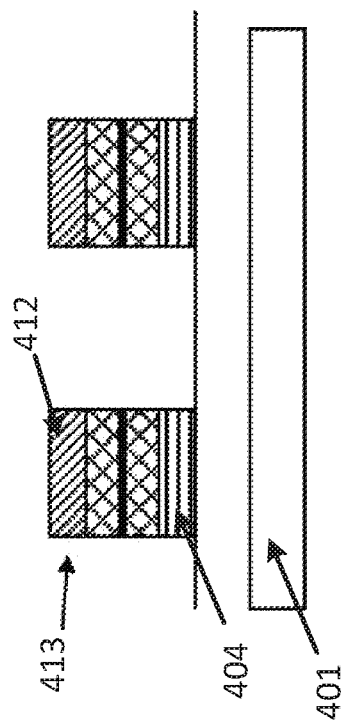
Figure 12G:
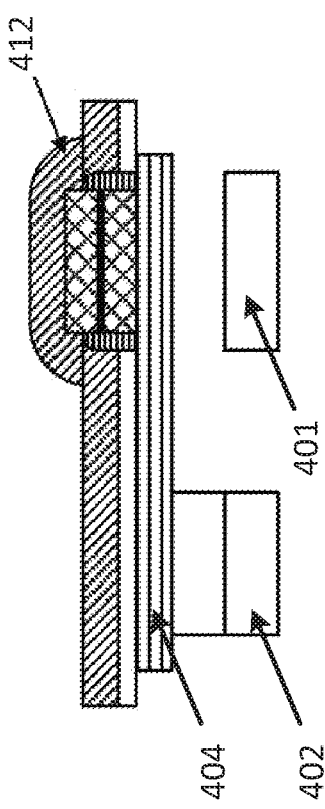
Figure 12H:
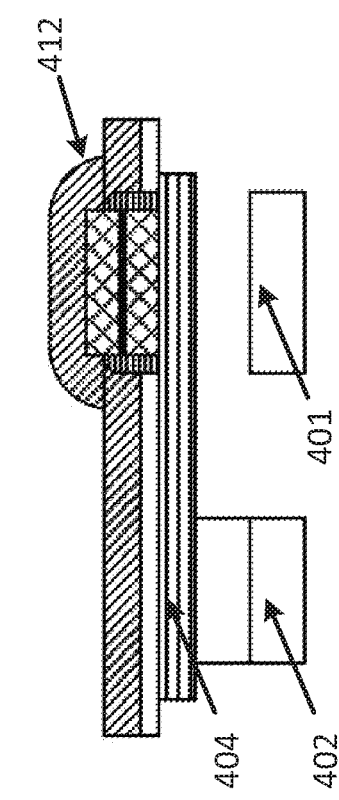

As shown in FIG. 12A, lower metal as write word line 401 and landing pad 402 to read device are patterned after FEOL process is completed. The surface over write word line is planerized with CMP. Bottom read lead 404, MTJ Pin layer 405, tunnel oxide 406, MTJ fixed layer 407 and hard mask layer are subsequently deposited as shown in FIG. 12B. With the same process step as previous embodiments, MTJ stack 408 is patterned as a line along word line direction as shown in FIGS. 12C and FIG. 13A. Nitride spacer 409 is placed on side wall of MTJ line as shown in FIGS. 12D and 13B. Oxide 410 is deposited and planerized as shown in FIGS. 12E and 13C. The planerized oxide is recessed with vertical ion etching until top of MTJ line appears enough as shown in FIGS. 12F and 13D. Remained oxide 411 in FIG. 12F is to insulate upper metal from bottom read lead metal. Upper metal 412 such as aluminum/Cu alloy is deposited as shown in FIGS. 12G and 13E. Patterning photoresist, the upper metal is etched with conventional metal etching process by reaching to insulation oxide 411. Subsequent Ion milling etches oxide, MTJ and bottom read lead metal to get self-aligned structure 413 as shown in FIGS. 12H and 13F.

Figure 14A:
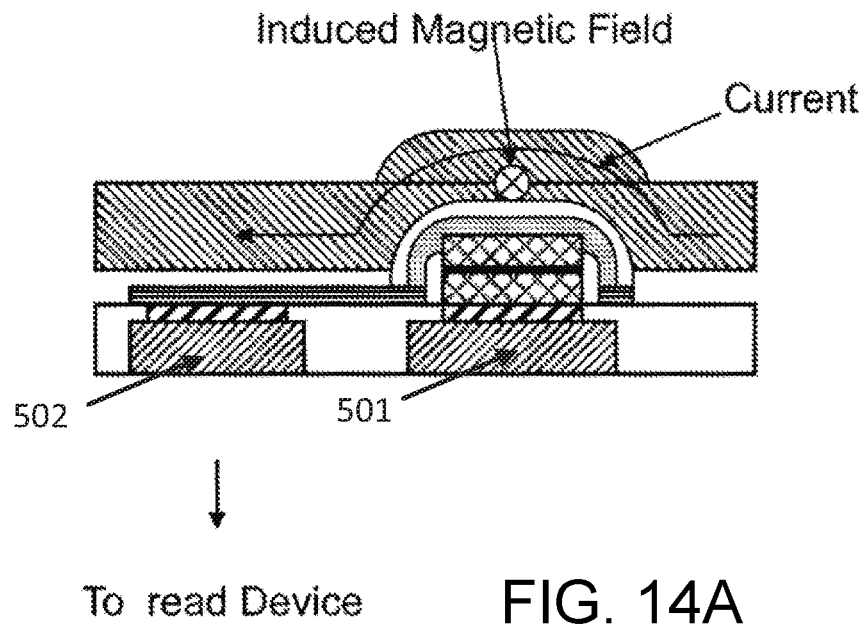
FIG. 14A illustrates a cross-sectional view of $5^{th}$ preferred embodiment.
Figure 14B:
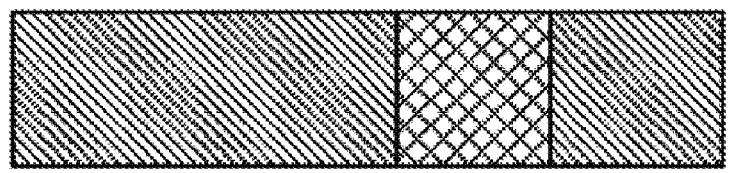
FIG. 14B illustrates a top view $5^{th}$ embodiment.

A cross-sectional view of the 5$^{th}$ embodiment is shown in FIG. 14A. A top view of the 5$^{th}$ embodiment is shown in FIG. 14B. MTJ is connected lower metal line (write word line) instead of connecting upper metal as adapted in previous embodiments. Read lead is connected to top of MTJ different from previous 4 embodiments. Thin oxide separates upper metal and read lead/MTJ electrically. MTJ is also patterned twice along word line direction first and bit line direction 2$^{nd}$ as was the case with the 4$^{th}$ embodiment. At 2$^{nd}$ patterning, upper metal layer, MTJ and bottom read lead are patterned with one mask. No overlay margin is required so that upper metal width becomes same feature size as MTJ. It save 4∂ compared to conventional structure showed in Prior Art FIG. 1A and FIG. 1B. The structure has other benefit than cell size. The upper metal wraps around the MTJ. The current flowing the metal induces stronger magnetic field than straight metal line. It works better to switch the pin layer direction.

Figure 15A:
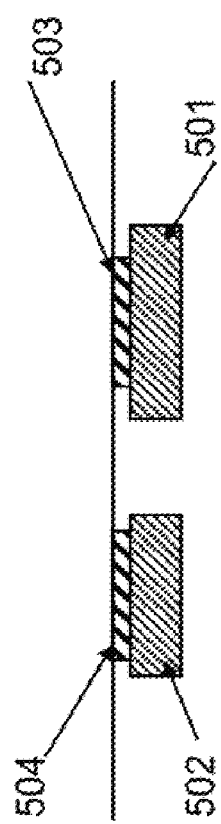
FIG. 15A to FIG. 15E illustrate cross sectional views along bit line direction at individual process steps to the $5^{th}$ embodiment.

As shown in FIG. 15A, lower metal as write word line 501 and landing pad 502 to read device are patterned after FEOL process is completed. The vias 503 and 504 to be connected to MTJ and read lead metal are opened over 501 and 502.

Figure 16A:
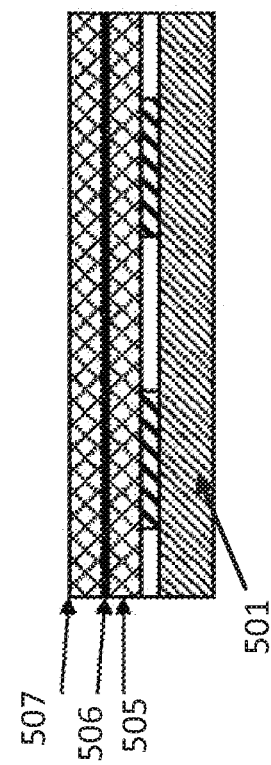
FIG. 16A to FIG. 16D illustrate cross sectional views along other direction of FIG. 15B to FIG. 15E.
Figure 15B:
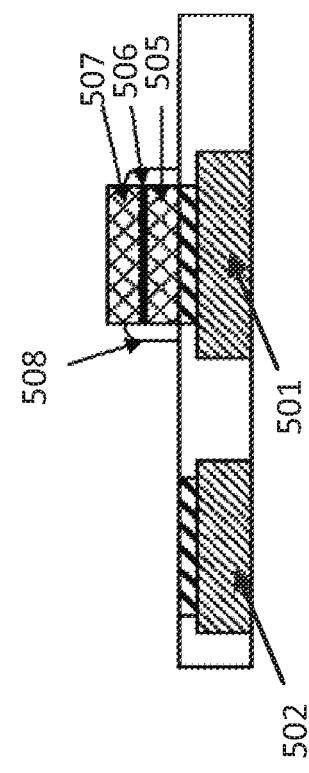
Figure 15C:
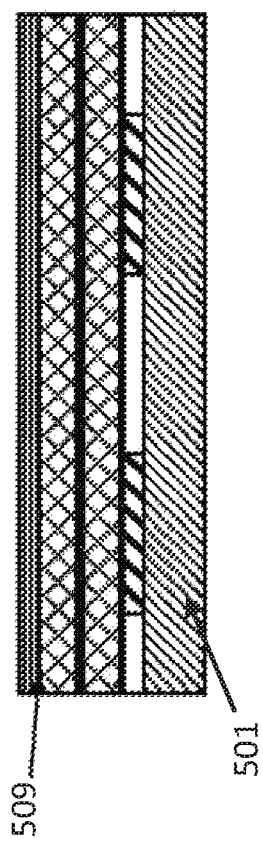
Figure 15D:
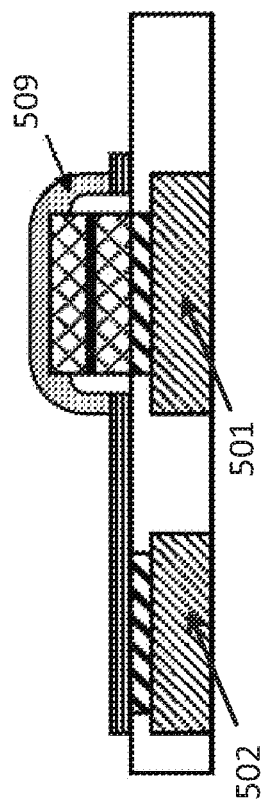
Figure 16B:
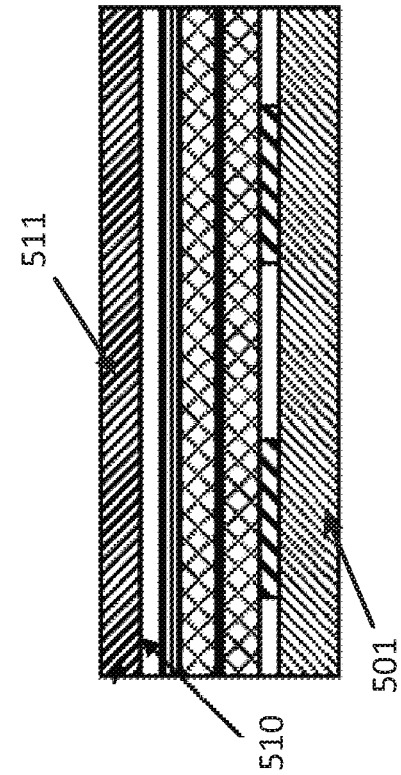
Figure 16C:
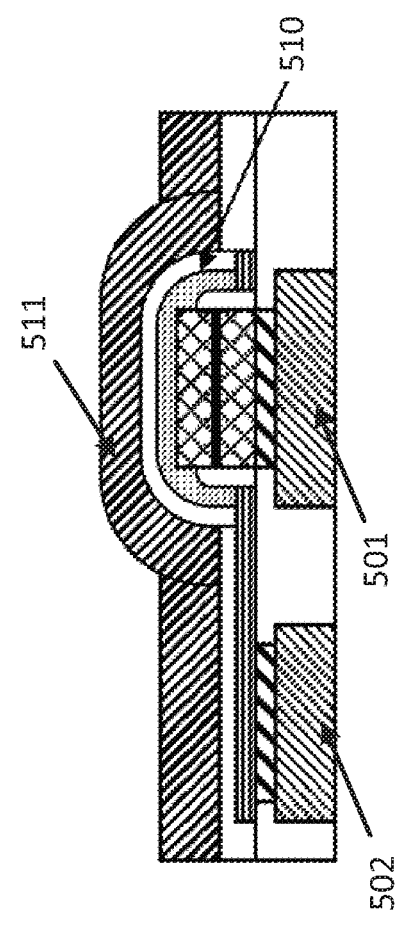
Figure 16D:
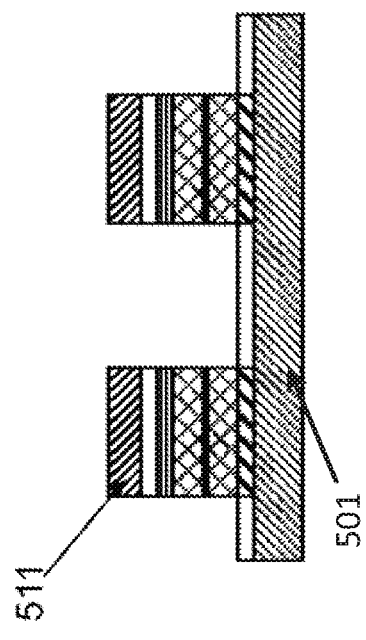
Figure 15E:
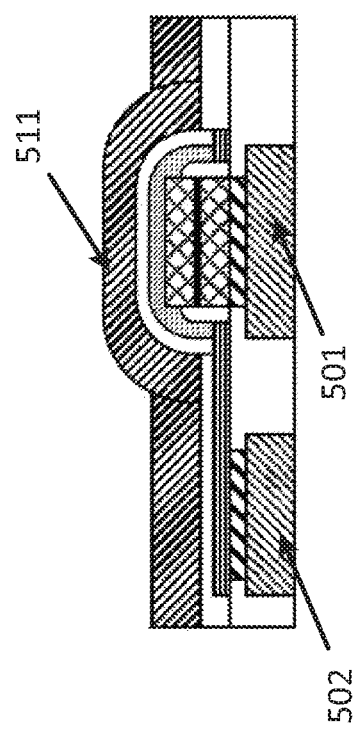

Tungsten is deposited and allows CMP to make the surface smooth. MTJ Pin layer 505, tunnel oxide 506, MTJ fixed layer 507 and hard mask layer are subsequently deposited as previous embodiments. The stack is patterned as a line along the word line direction and followed by spacer oxide protect the MTJ sidewall as shown in FIGS. 15B and 16A. Read metal 509 is deposited and patterned as shown in FIGS. 15C and 16B. With the same process step as previous embodiments, Thin oxide 510 is deposited to insulate MTJ/Read Metal and upper metal (Bit line). Upper metal 511 such as aluminum/Cu alloy is deposited as shown in FIGS. 15D and 16C. Patterning photoresist, the upper metal is etched with conventional metal etching process by reaching to insulation oxide 510. Oxide 510 can be removed by wet etch. Subsequent Ion milling etches read lead metal, MTJ as shown in FIGS. 15E and 16D.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

What is claimed is:

1. A method of fabricating a magnetic memory cell, the method comprising:
    forming a write word line and a landing pad in a substrate such that an upper surface of the write word line is below an upper surface of the substrate;
    forming a read lead layer on the upper surface of the substrate and electrically coupled to the landing pad;
    forming a plurality of memory element layers such that at least one memory element layer is electrically coupled to the read lead layer;
    forming a hard mask layer over the plurality of memory element layers;
    patterning the hard mask layer to form a hard mask pattern comprising a hard mask cap positioned over the write word line;
    transferring the hard mask pattern to the plurality of memory element layers to form a memory element stack from the plurality of memory element layers, wherein the memory element stack is positioned over the write word line and covered with the hard mask cap of the hard mask layer, and wherein the hard mask cap is self-aligned with the memory element stack as a result of said transferring the hard mask pattern;
    after said transferring of the hard mask pattern to the plurality of memory element layers, etching the read lead layer to form a plurality of read leads that include a read lead electrically coupled to the memory element stack;
    depositing an oxide layer over the hard mask cap and the memory element stack;
    forming a trench above the hard mask cap and the memory element stack by etching the oxide layer until at least a top surface of the hard mask cap is exposed;
    removing the hard mask cap exposed via the trench to obtain a hole that is self-aligned with the memory element stack;
    depositing a seed layer in the hole; and
    filling the hole and the trench with conductive material to obtain a conductive structure that is self-aligned with the memory element stack.

2. The method of claim 1, wherein said forming the plurality of memory element layers comprises:
    forming a pin layer;
    forming a tunnel oxide layer on the pin layer; and
    forming a fixed layer on the tunnel oxide layer.

3. The method of claim 2, wherein said transferring the hard mask pattern comprises transferring the hard mask pattern to the fixed layer, the tunnel oxide layer, and the pin layer to obtain the memory element stack.

4. The method of claim 1, wherein:
    said patterning the hard mask layer comprises performing a lithographic and mask etch process to form the hard mask pattern from the hard mask layer; and said transferring the hard mask pattern to the plurality of memory element layers comprises, after the lithographic and mask etch process, ion milling the plurality of memory element layers using the hard mask cap of the hard mask pattern as a mask to form the memory element stack, wherein said ion milling self-aligns the hard mask cap with the memory element stack.

5. The method of claim 1, wherein said filling the hole and trench forms another read lead layer that is electrically coupled to the memory element stack.

6. The method of claim 1, wherein the hard mask layer comprises an oxide layer formed over the plurality of memory element layers and a nitride layer formed over the oxide layer of the hard mask layer.

7. The method of claim 6, wherein said removing the hard mask cap comprises:
using an acid to remove the nitride layer of the hard mask cap; and
etching the oxide layer of the hard mask cap until at least an upper surface of the memory element stack is exposed.

8. The method of claim 1, wherein said filling the hole and the trench comprises plugging copper in the trench with electroplating.

9. The method of claim 8, further comprising removing excess copper outside of the trench via chemical mechanical polishing.

10. A method of fabricating a magnetic memory cell, the method comprising:
forming a write word line and a landing pad in a substrate such that an upper surface of the write word line is below an upper surface of the substrate;
forming a read lead layer on the upper surface of the substrate and electrically coupled to the landing pad;
forming a plurality of memory element layers such that at least one memory element layer is electrically coupled to the read lead layer;
forming a hard mask layer over the plurality of memory element layers;
patterning the hard mask layer to form a hard mask pattern comprising a hard mask cap positioned over the write word line;
transferring the hard mask pattern to the plurality of memory element layers to form a memory element stack from the plurality of memory element layers, wherein the memory element stack is positioned over the write word line and covered with the hard mask cap of the hard mask layer, and wherein the hard mask cap is self-aligned with the memory element stack as a result of said transferring the hard mask pattern;
after said transferring of the hard mask pattern to the plurality of memory element layers, etching the read lead layer to form a plurality of read leads that include a read lead electrically coupled to the memory element stack;
depositing an oxide layer over the hard mask cap and the memory element stack;
forming a trench above the hard mask cap and the memory element stack by etching the oxide layer until at least a top surface of the hard mask cap is exposed;
removing the hard mask cap exposed via the trench to obtain a hole that is self-aligned with the memory element stack; and
electroplating the trench and the hole with copper.

11. The method of claim 10, wherein said forming the plurality of memory element layers comprises:
forming a pin layer;
forming a tunnel oxide layer on the pin layer; and
forming a fixed layer on the tunnel oxide layer.

12. The method of claim 11, wherein said transferring the hard mask pattern comprises transferring the hard mask pattern to the fixed layer, the tunnel oxide layer, and the pin layer to obtain the memory element stack.

13. The method of claim 10, wherein:
said patterning the hard mask layer comprises performing a lithographic and mask etch process to form the hard mask pattern from the hard mask layer; and
said transferring the hard mask pattern to the plurality of memory element layers comprises, after the lithographic and mask etch process, ion milling the plurality of memory element layers using the hard mask cap of the hard mask pattern as a mask to form the memory element stack, wherein said ion milling self-aligns the hard mask cap with the memory element stack.

14. The method of claim 10, wherein said electroplating forms another read lead layer that is electrically coupled to the memory element stack.

15. The method of claim 10, wherein the hard mask layer comprises an oxide layer formed over the plurality of memory element layers and a nitride layer formed over the oxide layer of the hard mask layer.

16. The method of claim 15, wherein said removing the hard mask cap comprises:
using an acid to remove the nitride layer of the hard mask cap; and
etching the oxide layer of the hard mask cap until at least an upper surface of the memory element stack is exposed.

17. The method of claim 10, wherein:
said patterning the hard mask layer comprises performing a lithographic and mask etch process to form the hard mask pattern from the hard mask layer; and
said transferring the hard mask pattern to the plurality of memory element layers comprises, after the lithographic and mask etch process, reactive ion etching the plurality of memory element layers using the hard mask cap of the hard mask pattern as a mask to form the memory element stack, wherein said reactive ion etching self-aligns the hard mask cap with the memory element stack.

18. The method of claim 1, wherein:
said patterning the hard mask layer comprises performing a lithographic and mask etch process to form the hard mask pattern from the hard mask layer; and
said transferring the hard mask pattern to the plurality of memory element layers comprises, after the lithographic and mask etch process, reactive ion etching the plurality of memory element layers using the hard mask cap of the hard mask pattern as a mask to form the memory element stack, wherein said reactive ion etching self-aligns the hard mask cap with the memory element stack.

* * * * *